United States Patent [19]

Bafaro

[11] 4,270,126
[45] May 26, 1981

[54] VIDEO AMPLIFIER ARRANGEMENT WITH WIDEBAND D-C GAIN CONTROL

[75] Inventor: Michael P. Bafaro, Park Ridge, Ill.

[73] Assignee: Motorola, Inc., Schaumburg, Ill.

[21] Appl. No.: 86,548

[22] Filed: Oct. 19, 1979

[51] Int. Cl.³ .............................................. G08B 5/36
[52] U.S. Cl. .................................... 340/748; 315/383; 340/793; 358/168
[58] Field of Search ................ 340/748, 793; 315/383; 358/168

[56] References Cited

U.S. PATENT DOCUMENTS

| | | | |
|---|---|---|---|
| 4,005,262 | 1/1977 | Fijisawa et al. | 358/168 |
| 4,025,843 | 5/1977 | Parker | 323/22 T |

Primary Examiner—David L. Trafton
Attorney, Agent, or Firm—Donald B. Southard; James W. Gillman

[57] ABSTRACT

An improved video amplifier arrangement with wideband D-C gain control is disclosed for use in a video display device of the type for displaying character information. The video amplifier includes an open-collector, TTL logic gate for receiving digital voice signal information which is then coupled to a cascode amplifier circuit for amplifying the video information and applying the same to a control element of an associated cathode ray tube. A D-C amplifier is provided having an adjustable element in its base input for applying a selectable D-C voltage thereto. The D-C amplifier includes an emitter resistor which is also connected to the open collector of the logic gate whereby the current developed by the D-C amplifier and applied to the emitter load resistor further determines the load current through the TTL logic gate. This, in turn, controls the level of pulse amplitude of the digital video information and serves as a video gain or level control.

5 Claims, 5 Drawing Figures

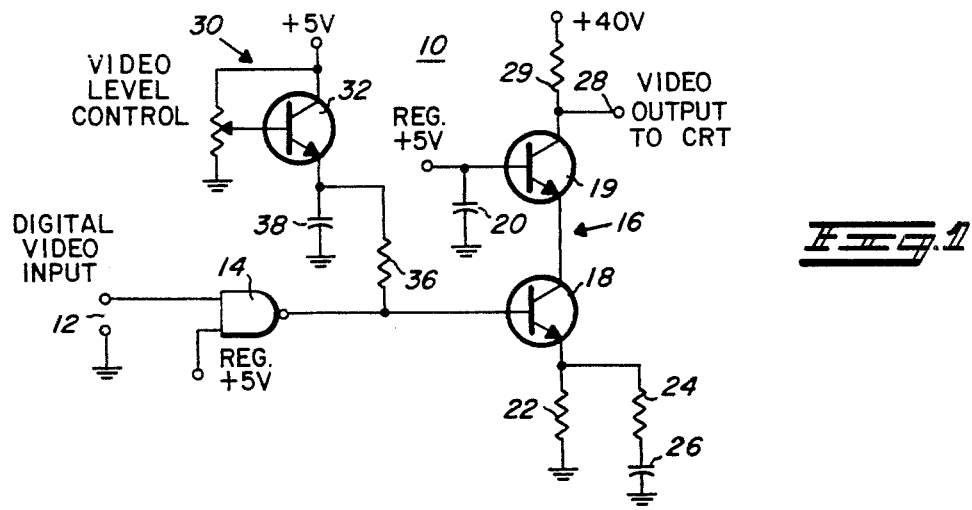
_Fig. 1_
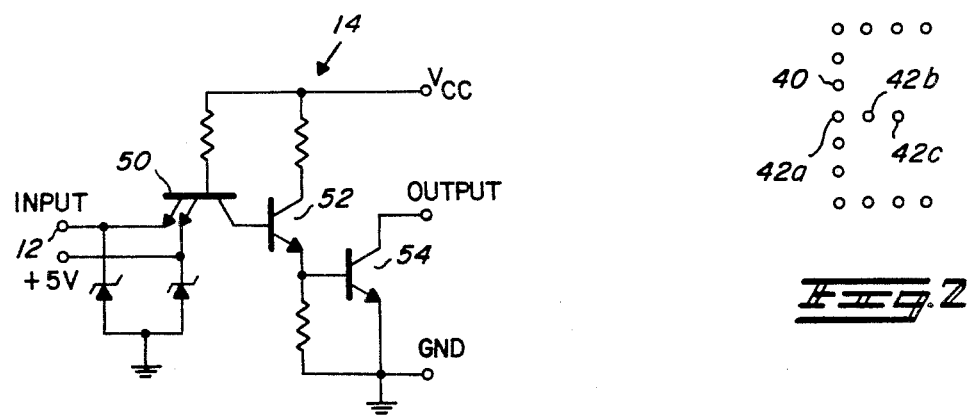
_Fig. 3_
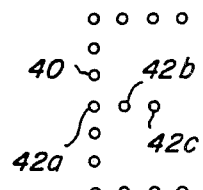
_Fig. 2_
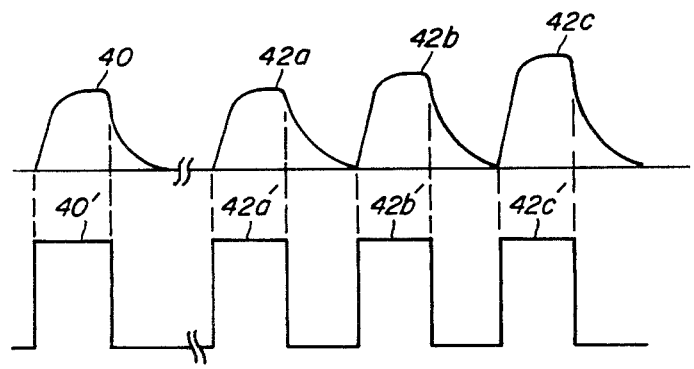
_Fig. 4A_
_Fig. 4B_

VIDEO AMPLIFIER ARRANGEMENT WITH WIDEBAND D-C GAIN CONTROL

BACKGROUND OF THE INVENTION

The present invention relates generally to video display devices of the type for displaying characters and, more particularly, to an improved video amplifier arrangement for use therein with wideband variable D-C gain or level control providing an essentially flat response across the operating range.

In video display devices of the type for displaying character information in the form of letters and numbers, the video information is essentially in pulse form. That is, the video signal translated through the processing circuitry, including the video amplifier stages, is either all black or all white (full on or full off) to form the dots which are arranged in the desired character patterns on display.

The digital video signal information representing the characters to be displayed is in the form of pulse trains, some long, some relatively short. It will be appreciated that such pulse train information is particularly susceptible to deterioration and degradation if transmitted over substantial lengths of transmission cabling. Rise times of the individual pulses may be as sharp as five nanoseconds. This translates to around 50 MHz in terms of frequency response. It will be further appreciated that the amplitude level of the respective pulses in a pulse train will vary thereby causing a variation in brightness level regarding the displayed characters on the face of the associated cathode ray screen.

In addition, the control of the video level in such devices has, in the past, utilized conventional potentiometer across which the normalized video signal is applied. The distributed capacitance between the center arm and the resistance element varies with the setting. Accordingly, frequency response is not uniform, and there is, in fact, a high frequency roll-off, which may severely affect picture presentation.

SUMMARY OF THE INVENTION

Accordingly, it is an object of the present invention to provide an improved video amplifier arrangement which overcomes the foregoing deficiencies.

Another object of the present invention is to provide an improved video amplifier arrangement which includes a video level adjustment for controlling gain with D-C and without loss of frequency response.

Still another object of the present invention is to provide an improved video amplifier arrangement with video level adjustment of the foregoing type which is simple in design, low in cost and which exhibits a high degree of reliability in operation.

In practicing the invention, an improved video amplifier arrangement is provided for applying a source of digital video pulse information to suitable control elements of an associated cathode ray tube for display. The amplifier arrangement includes the driver cascode amplifier having its output coupled to the CRT control element and an input coupled to the output of an open-collector, logic gate. The gate is intended to receive and normalize a source of digital pulse signals transmitted over transmission line cabling which may introduce pulse distortions. A D-C amplifier is included having an output coupled to a load resistor which forms the collector load for the logic gate. A variable adjustable element, or potentiometer, is provided in the input of the variable D-C amplifier. The D-C amplifier has its collector coupled to a D-C source and this provides a variable load current through the logic gate.

BRIEF DESCRIPTION OF THE DRAWINGS

The features of the present invention which are believed to be novel are set forth with particularity in the appended claims. The invention, itself, together with further objects and advantages thereof, may best be understood by reference to the following description taken in conjunction with the accompanying drawings, in which:

FIG. 1 is a schematic representation of a video amplifier arrangement which has been constructed in accordance with the present invention;

FIG. 2 is a graphic illustration of a character displayed on a video display device;

FIG. 3 is a schematic representation of a conventional logic gate, which gate is included in the circuitry of FIG. 1; and FIGS. 4A and 4B are a graphic representation of waveforms showing the operation of digital signal information through the logic gate of FIG. 3.

DESCRIPTION OF THE PREFERRED EMBODIMENT

In the drawings, an improved video amplifier arrangement 10 is shown in FIG. 1, which video amplifier arrangement has been constructed in accordance with the present invention. Amplifier circuit 10 includes a pair of input terminals 12, one of which is connected to an input of a logic gate 14. Gate 14 includes an additional input connected to a source of D-C potential and an output coupled to the input of a cascode amplifier circuit 16, comprised of transistors 18 and 19. Transistor 18 is connected as a common emitter amplifier and transistor 19 is connected as a common base amplifier, the latter having its input base coupled to a source of D-C potential, with a capacitor 20 from its input base to ground to serve as a bypass for video signal energy. The emitter of transistor 19 is connected to the collector of transistor 18. The emitter of transistor 18 is connected to a resistor 22 to ground in parallel with a series connected circuit of a resistance 24 and the capacitance 26. Resistor 22 serves to determine the low frequency voltage gain of cascode amplifier circuit 16 and resistor 24 and capacitor 26 provides the necessary high frequency compensation to insure an essentially flat response characteristic. The output 28 of amplifier 16 is developed across collector load resistor 29 connected to a source of operating potential. The output of amplifier circuit 16, of course, is intended to be coupled to a suitable control element of a cathode ray tube (not shown).

The video amplifier arrangement 10 further includes a D-C amplifier 30. Amplifier 30 includes a transistor 32 having an input (base) coupled to a variable, adjustable element, or potentiometer, 34. The potentiometer 34 is connected between a source of D-C potential and ground as indicated and includes an adjustable arm 34A connected to the input-base of transistor 32. The collector of transistor 32 is likewise connected to a source of operating power, with the output thereof being taken at its emitter electrode. Resistor 36 serves as the emitter load resistor of transistor 32 as well as the collector load for the logic gate 14. A capacitor 38 connected between the emitter of transistor 32 and ground serves as a high frequency bypass filter for transistor 32.

The logic gate 14 is intended to provide a termination for the digital video signal information which may travel over substantial lengths of transmission line cabling. As such, the pulses forming the video information may show a significant degree of deterioration in both rise and fall times as depicted in FIG. 4A. These pulses represent the dot location of a character to be displayed on the screen of an associated display device (not shown). For illustration purposes only, such characters may, for example, be the letter "E" in FIG. 2, the single pulse 40 being the location of the dot 40 in FIG. 2 and the pulses 42a, 42b and 42c being the dots of the middle arm of the letter "E" as shown. In FIG. 4A, it will be seen that the rise and fall times of pulse 40 have substantially deteriorated due to the lumped impedance characteristics of the transmission line over which it has been transmitted. In addition, the amplitude has also been reduced. In the pulse train comprised of pulses 42a, 42b and 42c, the same deterioration of rise and fall times has occurred, but in addition, there is a variation in the pulse amplitude between pulse 42a and 42c, giving rise to a variation in the perceived brightness of the respective dots as displayed on the screen face.

Accordingly, some method of at least a partial restoration of pulse rise and fall times is desired as well as a normalization of the pulses overall. Logic gate 14 provides this function. Video pulse information presented to its input terminals is normalized to a desired digital output such as that depicted in FIG. 4B, regardless of distortions to its amplitude and rise and fall times, as previously mentioned. The circuitry of gate 14 is shown in FIG. 3. The gate 14 includes a common base amplifier 50 and two common emitter amplifiers 52 and 54 in the manner indicated. The collector of transistor amplifier 54 remains unconnected, or open, as previously described. Logic gate 14 is a standard integrated circuit manufactured by a number of semiconductor manufacturers under the standard designation 74S38. As such, the operation is well known in the art such that further and more detailed operational description is deemed unnecessary.

In operation, digital video signal information, such as that as shown in FIG. 4A, is transmitted over a conventional transmission line cabling and is coupled to the input terminals 12 of the open collector, logic gate 14. The pulse information is normalized and restored to a preset condition, such as that shown in FIG. 4B, wherein rise time may be on the order of five nanoseconds. This translates to a frequency response of some 50 MHz. The normalized digital video signal information is then applied to cascode amplifier circuit 16 where it is amplified to a predetermined level before being applied to the particular control element of the associated cathode ray tube. Cascode amplifier circuit 16 will be understood by those skilled in the art to effect a minimization in the Miller capacitance effect. The Miller capacitance effect is the amplification of the interelectrode capacitance between the output (collector) and (input) base of the transistor by its beta gain factor. In the arrangement of the cascode amplifier circuit 16, transistor 18 is essentially a current amplifier and effects little or no voltage gain.

As will also be appreciated, the amplitude of the digital pulse information applied to the cathode ray tube face determines the perceived brightness of the characters dis- The control of the video gain level which determines brightness is set by the D-C amplifier 32. The potentiometer 34 sets the current level as translated by transistor 32, which also determines the load current through resistor 36, and in turn, the current through logic gate 14. In this way, a variable pulse amplitude is generated for application to the input of the cascode amplifier 16. Further, since gate 14 is working into a low and constant impedance, the frequency response is exceptionally flat. This differs significantly from prior devices where the video signal information is developed across a potentiometer and where the distributed capacitance varies according to the setting of the arm of the potentiometer. The usual result was a substantial high frequency roll-off. In practice, the response of the video amplifier arrangement of the present invention is substantially flat to within 3 db for pulse widths from D-C to as sharp as five nanoseconds (50% duty cycle). Moreover, the gain from the output of circuit 16 may be made to vary continuously from zero to approximately 19 db.

Accordingly, it will be seen that an improved video amplifier arrangement has been disclosed which includes a wideband D-C gain control comprised of a single emitter follower, a load resistor and an open collector TTL logic gate. In this matter, video gain or level is effectively controlled with D-C without high circuit complexity and no loss of frequency response.

What is claimed is:

1. An improved video amplifier arrangement for applying a source of digital video pulse signals to the control element of a cathode ray tube, comprising in combination:

amplifier means having an input and an output coupled to the control element of the CRT;

open-collector logic gate means having an input for receiving the source of digital video pulse signals and an output coupled to said input of said amplifier means; and D-C amplifier means having an output coupled to the output of said logic gate, said D-C amplifier means including variable adjustable means for determining the output current therefrom and, in turn, the load current through said logic gate means.

2. An improved video amplifier arrangement in accordance with claim 1 wherein said amplifier means includes a cascode amplifier circuit having a first transistor connected as a common base amplifier with an emitter coupled to the collector of a second transistor connected as a common emitter amplifier.

3. An improved video amplifier arrangement in accordance with claim 2 wherein said second transistor of said cascode amplifier includes a resistance in the emitter circuit thereof for determining the low frequency voltage gain in parallel with a resistance in series with the capacitance for providing high frequency compensation to insure flat frequency response.

4. An improved video amplifier arrangement in accordance with claim 1 wherein said D-C amplifier includes a transistor connected as an emitter follower with a load resistance connected between the emitter of said D-C amplifier transistor and the open collector of said logic gate, whereby the current developed by said D-C amplifier transistor in said load resistor determines the current through said logic gate.

5. An improved video amplifier arrangement in accordance with claim 4 wherein said variable adjustable means is a potentiometer connected between a source of D-C potential and ground and having a center arm connected to the input of said D-C amplifier transistor.

* * * * *

UNITED STATES PATENT AND TRADEMARK OFFICE
CERTIFICATE OF CORRECTION

PATENT NO. : 4,270,126
DATED : May 26, 1981
INVENTOR(S) : MICHAEL P. BAFARO

It is certified that error appears in the above—identified patent and that said Letters Patent is hereby corrected as shown below:

In Column 3, line 66, "dis" should read --"display."

Signed and Sealed this

Third Day of November 1981

[SEAL]

Attest:

GERALD J. MOSSINGHOFF

Attesting Officer     Commissioner of Patents and Trademarks